US008039351B2

(12) United States Patent
Adam et al.

(10) Patent No.: US 8,039,351 B2
(45) Date of Patent: Oct. 18, 2011

(54) METHOD OF FABRICATING HETERO-JUNCTION BIPOLAR TRANSISTOR (HBT)

(75) Inventors: Thomas N. Adam, Poughkeepsie, NY (US); Rajendran Krishnasamy, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/732,560

(22) Filed: Mar. 26, 2010

(65) Prior Publication Data

US 2010/0178746 A1    Jul. 15, 2010

Related U.S. Application Data

(62) Division of application No. 11/969,448, filed on Jan. 4, 2008, now Pat. No. 7,759,702.

(51) Int. Cl.
*H01L 21/8222* (2006.01)
(52) U.S. Cl. ............. 438/311; 257/21.608; 257/197; 257/199; 257/200; 257/201; 438/318
(58) Field of Classification Search .......... 257/197, 257/199, 200, 201, E21.608; 438/311, 318
See application file for complete search history.

(56) References Cited

U.S. PATENT DOCUMENTS

| | | | |
|---|---|---|---|
| 3,569,800 A | 3/1971 | Collins | |
| 5,344,785 A * | 9/1994 | Jerome et al. | 438/311 |
| 5,506,427 A * | 4/1996 | Imai | 257/197 |
| 6,509,242 B2 | 1/2003 | Frei et al. | |
| 7,037,798 B2 | 5/2006 | Adam et al. | |
| 7,504,704 B2 * | 3/2009 | Currie et al. | 257/510 |
| 2003/0012925 A1 | 1/2003 | Gorrell | |
| 2006/0105533 A1 * | 5/2006 | Chong et al. | 438/322 |
| 2007/0238276 A1 * | 10/2007 | Liu et al. | 438/592 |

OTHER PUBLICATIONS

U.S. Appl. No. 11/969,448, filed Jan. 4, 2008, Notice of Allowance and Fees Due dated Mar. 10, 2010.
U.S. Appl. No. 11/969,448, filed Jan. 4, 2008, Office Action dated Sep. 16, 2009.

* cited by examiner

*Primary Examiner* — Wai Sing Louie
*Assistant Examiner* — Bilkis Jahan
(74) *Attorney, Agent, or Firm* — Hoffman Warnick LLC; Joseph Petrokaitis

(57) ABSTRACT

A method of fabricating a hetero-junction bipolar transistor (HBT) is disclosed, where the HBT has a structure incorporating a hetero-junction bipolar structure disposed on a substrate including of silicon crystalline orientation <110>. The hetero-junction bipolar structure may include an emitter, a base and a collector. The substrate may include a shallow-trench-isolation (STI) region and a deep trench region on which the collector is disposed. The substrate may include of a region of silicon crystalline orientation <100> in addition to silicon crystalline orientation <110> to form a composite substrate by using hybrid orientation technology (HOT). The region of crystalline orientation <100> may be disposed on crystalline orientation <110>. Alternatively, the region of silicon crystalline orientation <110> may be disposed on crystalline orientation <100>.

11 Claims, 3 Drawing Sheets

METHOD OF FABRICATING HETERO-JUNCTION BIPOLAR TRANSISTOR (HBT)

CROSS REFERENCE TO RELATED APPLICATIONS

This application is a divisional of U.S. patent application Ser. No. 11/969,448, filed on Jan. 4, 2008 now U.S. Pat. No. 7,759,702, which is hereby incorporated in its entirety.

BACKGROUND

1. Technical Field

The disclosure relates to hetero-junction bipolar transistor (HBT) fabrication and the structure thereof. More particularly, the disclosure relates to fabrication of a HBT using <110> crystalline orientation.

2. Related Art

In the current state of the art, hetero-junction bipolar transistors (HBTs) are fabricated by epitaxially growing desired semiconductor layers to form an emitter layer, a base layer, and a collector layer on a semiconductor substrate. The semiconductor substrate usually has a plane of <100> crystalline orientation as a main surface. HBTs present numerous advantages as high performance transistors because of the different semiconductor materials used for forming the emitter, base and collector therein. The difference in semiconductor materials creates different energy band-gaps that form hetero-junctions therebetween. Graded base junctions, formed with silicon germanium (SiGe) where germanium is graded therein, are of particular interest as resulting drift fields accelerate minority carriers injected from the emitter through the base toward the collector. As a result, carrier transit time is reduced, improving high-frequency performance through increased emitter injection efficiencies, reduced base resistance and base-emitter capacitance. Improved high-frequency performance in HBTs generally permits higher cut-off frequencies over silicon bipolar junction transistors (BJTs).

With increasing demand for high performance transistors, there is a need to further enhance carrier mobility. Improvements on currently known technologies in the fabrication of metal oxide semiconductors (MOS) include fabricating HBTs on silicon-on-insulators (SOIs), which typically has a surface crystalline orientation <100>. However, demands on efficiency of devices incorporating transistors necessitate faster/higher performance and hence greater carrier mobility/speed in the transistors. Currently available HBTs, which are fabricated on silicon (Si) substrates of <100> crystalline orientation have limited carrier mobility, particularly in pnp-type HBTs, which ultimately presents difficulty in the fabrication of complementary bipolar CMOS (CBiCMOS) circuits.

SUMMARY

A method of fabricating a hetero-junction bipolar transistor (HBT) is disclosed, where the HBT has a structure incorporating a hetero-junction bipolar structure disposed on a substrate including of silicon crystalline orientation <110>. The hetero-junction bipolar structure may include an emitter, a base and a collector. The substrate may include a shallow-trench-isolation (STI) region and a deep trench region on which the collector is disposed. The substrate may include of a region of silicon crystalline orientation <100> in addition to silicon crystalline orientation <110> to form a composite substrate by using hybrid orientation technology (HOT). The region of crystalline orientation <100> may be disposed on crystalline orientation <110>. Alternatively, the region of silicon crystalline orientation <110> may be disposed on crystalline orientation <100>.

A first aspect of the disclosure provides a semiconductor device comprising: at least one hetero-junction bipolar transistor (HBT), the at least one HBT including: a substrate with <110> orientation; a collector disposed on the substrate; a base disposed on the collector to form a hetero-junction therebetween; and an emitter disposed on the base to form a hetero-junction therebetween, wherein the emitter, base and collector are electrically distinct.

A second aspect of the disclosure provides a hetero-junction bipolar transistor (HBT) comprising: a substrate of hybrid crystalline orientation, wherein the substrate includes at least one region of <110> crystalline orientation and at least one region of <100> crystalline orientation; at least one hetero-junction bipolar structure disposed on the substrate, the at least one hetero-junction bipolar structure including an emitter, a base and a collector, wherein the emitter is disposed on the base to form a hetero-junction therebetween, wherein the base is disposed on the collector to form a hetero-junction therebetween, and wherein the collector is disposed on the substrate.

A third aspect of the disclosure provides a method of fabricating a hetero-junction bipolar transistor, the method comprising: providing a substrate of at least one crystalline orientation; forming at least one hetero-junction bipolar structure on the substrate, the at least one hetero-junction bipolar structure including an emitter, a base and a collector, wherein the emitter is disposed on the base, the emitter and the base being electrically distinct, wherein the base is disposed on the collector, the base and the collector being electrically distinct, and the collector is disposed on the substrate.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
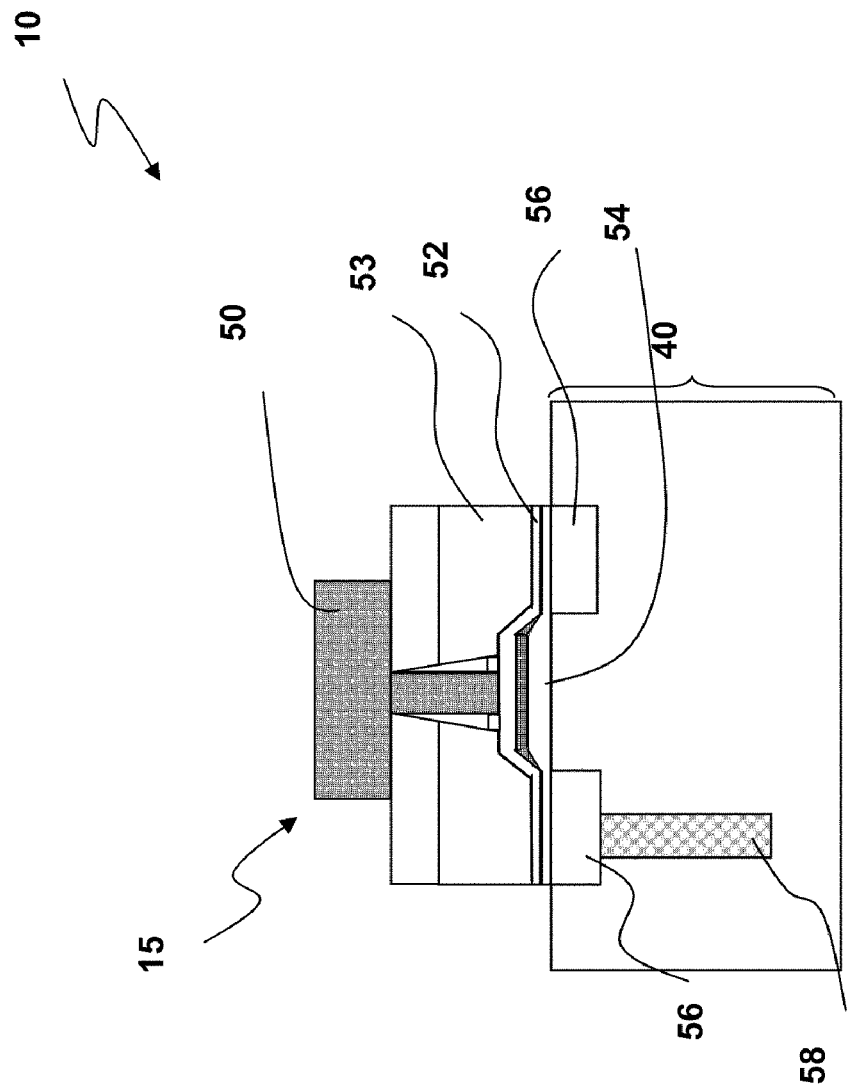
FIG. 1 illustrates a cross-sectional view of an embodiment of a structure of HBT fabricated on bulk silicon of <110> crystalline orientation.

The accompanying drawings are not to scale, and are incorporated to depict only typical aspects of the invention. Therefore, the drawings should not be construed in any manner that would be limiting to the scope of the invention. In the drawings, like numbering represents like elements between the drawings.

DETAILED DESCRIPTION

Figure 2:
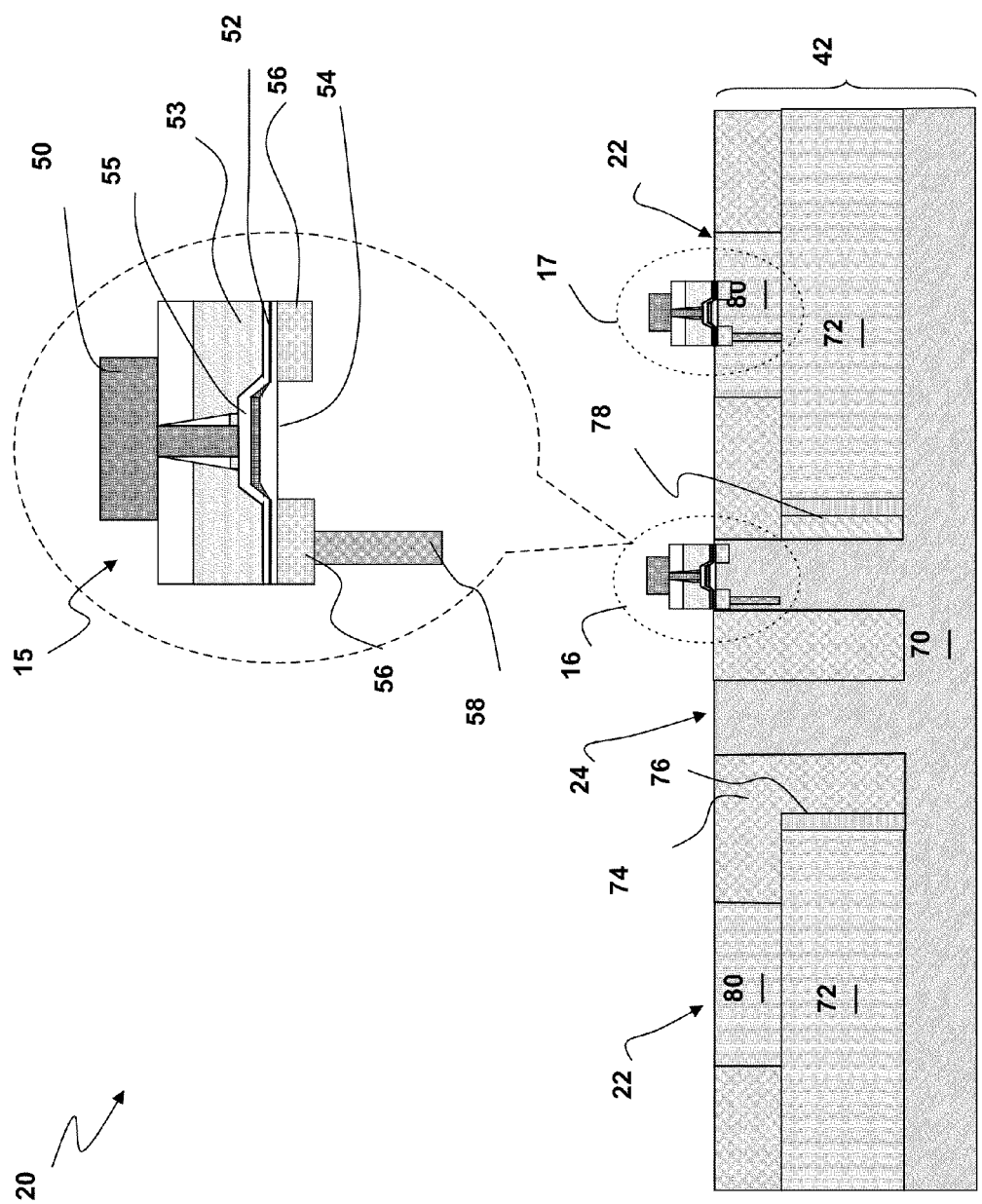
FIG. 2 illustrates a cross-sectional view of an embodiment of a structure of a HBT incorporating hybrid orientation technology (HOT).
Figure 3:
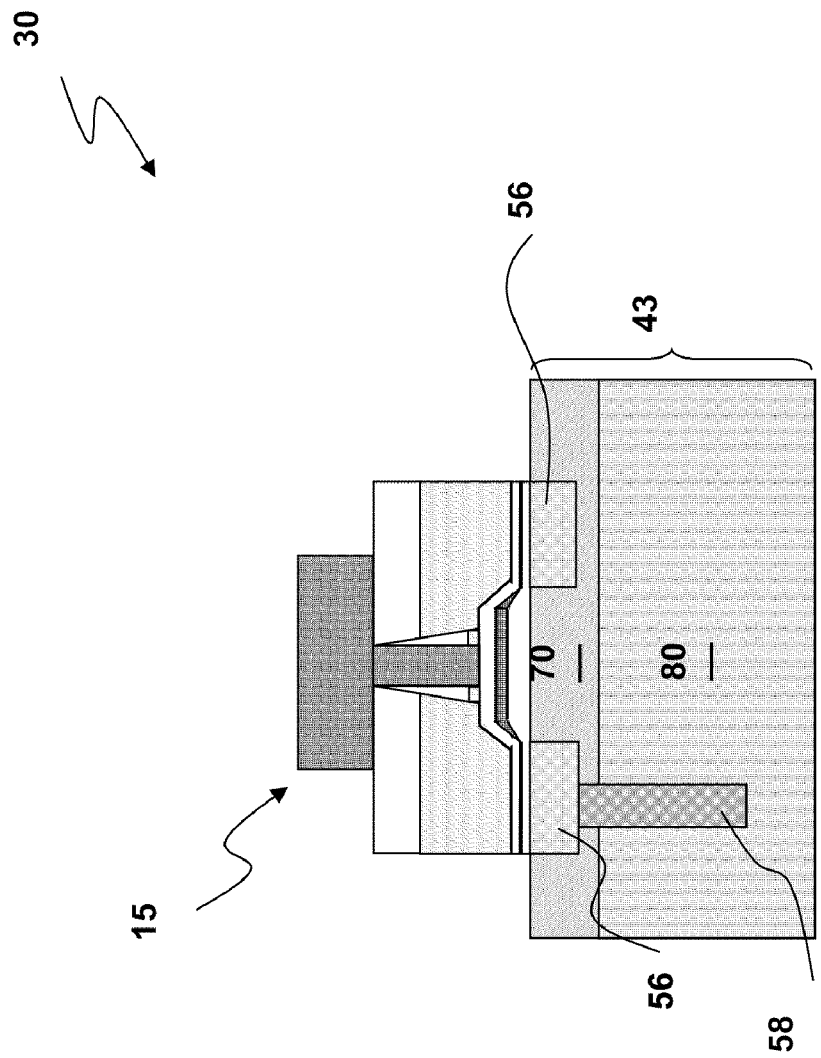
FIG. 3 illustrates a cross-sectional view of an alternative embodiment of a structure of a HBT incorporating hybrid orientation technology (HOT).

Embodiments depicted in FIGS. 1-3 illustrate different structures of hetero-junction bipolar transistors (HBTS) 10, 20 and 30 including a hetero-junction bipolar structure 15 fabricated on a silicon substrate of crystalline orientation <110>. The substrate may include silicon of other orientations by applying hybrid orientation technology (HOT). Each of HBTS 10, 20 and 30 may include npn or pnp transistors, or a combination of both.

FIG. 1 illustrates an exemplary embodiment HBT 10, fabricated by currently known or later developed processes to form a hetero-junction bipolar structure 15 on a substrate 40. Hetero-junction bipolar structure 15 includes emitter 50 disposed on base 52, which is disposed on collector 54. A portion of emitter 50 is surrounded by a dielectric material 53 including for example, but not limited to: silicon oxide, silicon nitride and silicon oxynitride. Collector 54 is disposed on substrate 40. Substrate 40 is formed of bulk silicon of crystalline orientation <110>. Substrate 40 may possibly include one or more conductive and/or insulating layers, and one or more active and/or passive devices/features, for example, but not limited to: shallow trench isolation (STI) region 56 and deep trench 58. HBT 10 may be an npn or a pnp transistor depending on dopants used and/or the degree of dopant concentration in emitter 50, base 52 and collector 54. An example of HBT may include non-complimentary BiCMOS. In an alternative embodiment (not shown), substrate 40 may include more than one hetero-junction bipolar structure 15 disposed thereon to form a plurality of HBTs. Each HBT formed thereon may be doped differently to form an npn-HBT or a pnp-HBT such that a mixture of differently doped HBTs may be formed on single substrate 40 of crystalline orientation <110>. For example, complementary BiCMOS circuits (e.g., npn+pnp devices on a single substrate) may be formed using the methodology described above. Small signal alternating current (AC) characteristics of pnp HBTs in complementary BiCMOS circuits so formed exhibit increased hole mobility improving high-performance applications.

FIG. 2 illustrates an alternative embodiment HBT 20, where hetero-junction bipolar structure 15 is formed on substrate 42, which may include a region with a mixture of crystalline orientation <110> and crystalline orientation <100>. Substrate 42 may also include a p-type metal oxide semiconductor (PMOS) 24 and a silicon-on-insulator (SOI) 22 regions fabricated by currently known or later developed hybrid orientation technology (HOT). Each of PMOS 24 and SOI 22 has a crystalline surface orientation of <110> and <100>, respectively. PMOS 24 is essentially formed of handle wafer 70 of bulk silicon of crystalline orientation <110>. SOI 22 is formed with silicon layer 80, of crystalline orientation <100>, disposed and selectively regrown on buried oxide (BOX) 72. BOX 72 is formed on handle wafer 70 by currently known or later developed fabrication techniques. In one or more regions on handle wafer 70, PMOS 24 and SOI 22 are formed using currently known HOT or later developed techniques. Currently known HOT may include standard CMOS techniques, for example, but not limited to: reactive ion etching (RIE), chemical vapor deposition (CVD) and chemical mechanical polishing (CMP). Substrate 42 may also include other conductive/insulating layers or active/passive devices/features, for example, high density plasma oxide 74, nitride spacer 76, high temperature oxide (HTO) 78 to prevent diffusion of current between the conductive layers within substrate 42.

Hetero-junction bipolar transistor (HBT) 20 is formed by having hetero-junction bipolar structure 15 disposed on substrate 42 to form HBT 16 and HBT 17 on each of PMOS 24 and SOI 22, respectively. Each of HBT 16 and HBT 17 may be doped to form a pnp-HBT or an npn-HBT. In an exemplary embodiment, HBT 16 is doped to form a pnp-HBT where enhanced hole mobility occurs in PMOS 24 of <110> crystalline orientation; and HBT 17 is doped to form an npn-HBT where electron mobility occurs in SOI 22 of <100> crystalline orientation.

Hetero-junction bipolar structure 15 may be fabricated using currently known or later developed technology, for example, but not limited to molecular beam epitaxy (MBE) or metal organic chemical vapor deposition (MOCVD). Collector 54 is first disposed on a surface of PMOS 24 and SOI 22 using currently known or later developed deposition techniques. Base 52 is deposited on collector 54 using currently known or later developed deposition techniques. Following deposition of base 52, emitter 50 is formed on base 52 using currently known or later developed techniques. Materials for forming emitter 50, base 52 and collector 54 may include, but are not limited to: doped and undoped silicon, silicon-carbon, and silicon-germanium. For HBT 16 to be a pnp-HBT on PMOS 24, emitter 50, base 52, and collector 54 in hetero-junction bipolar structure 15 are each respectively p-doped, n-doped and p-doped forming hetero-junctions therebetween. For HBT 17 to be an npn-HBT on SOI 22, emitter 50, base 52 and collector 54 in hetero-junction bipolar structure 15 are each respectively n-doped, p-doped and n-doped forming hetero-junctions therebetween. The process of fabricating HBTs may include formation of shallow trench isolation (STI) 56 and/or deep trench 58 regions in PMOS 24 and SOI 22 by currently known or later developed techniques.

HBTs formed on silicon of crystalline orientation <110> demonstrate an increased frequency of oscillation ($f_t/f_{max}$) in both npn-HBTs and pnp-HBTs with minimal observable degradation. In particular, pnp-HBTs present a frequency of oscillation of up to 2-3 times greater than HBTs formed on silicon of crystalline orientation <100>. With increased frequency of oscillation ($f_t/f_{max}$), resistance of emitter 50, base 52 and collector 54 are reduced. The enhancement of carrier mobility achieved in HBTs through the use of <110> crystalline orientation without structural changes adds to the enhancement achieved by local strain induced by graded or flat silicon germanium (SiGe) profile 55 in base 52.

FIG. 3 illustrates an alternative embodiment of a HBT 30 formed by fabricating hetero-junction bipolar structure 15 on substrate 43 formed by HOT. Substrate 43 includes top layer 70 of silicon crystalline orientation <110>, disposed on handle wafer 80 of crystalline silicon orientation <100>. HBT 30 may include shallow trench isolation (STI) 56 and/or deep trench 58 regions.

The foregoing description of various aspects of the invention has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:
1. A method of fabricating a hetero-junction bipolar transistor, the method comprising:
providing a substrate including a bulk silicon having a <110> crystalline orientation;
forming a buried oxide (BOX) within the bulk silicon having the <110> crystalline orientation;
forming a silicon-on-insulator (SOI) region over the BOX, where the SOI region has a <100> crystalline orientation;

forming a pnp hetero-junction bipolar structure on the bulk silicon having the <110> crystalline orientation, the pnp hetero-junction bipolar structure including;
an emitter, a base and a collector, wherein the emitter is formed over the base, wherein the base is formed over the collector, and the collector is disposed on the bulk silicon having the <110> crystalline orientation; and
forming a npn hetero-junction bipolar transistor (HBT) on the SOI region, the npn HBT including:
an npn collector disposed on the SOI region;
an npn base disposed on the collector to form a hetero-junction therebetween;
and
an npn emitter disposed on the base to form a hetero-junction therebetween.

2. The method according to claim 1, further comprising forming a shallow trench isolation (STI) region in each of the bulk silicon having the <110> crystalline orientation and the SOI region.

3. The method according to claim 1, further comprising forming a deep trench in each of the bulk silicon having the <110> crystalline orientation and the SOI region.

4. The method of claim 1, wherein the bulk silicon having the <110> crystalline orientation of the substrate is a handle wafer and the SOI region is disposed at least partially on the handle wafer.

5. The method of claim 4, wherein the npn HBT is disposed over the SOI region.

6. A method of fabricating a hetero-junction bipolar transistor (HBT), the method comprising:
providing a substrate including a bulk silicon having a <110> crystalline orientation;
forming a buried oxide (BOX) within the bulk silicon having the <110> crystalline orientation;
forming a silicon-on-insulator (SOI) region over the BOX, where the SOI region has a <100> crystalline orientation;
forming at least one hetero-junction bipolar structure over the substrate, the at least one hetero-junction bipolar structure being a pnp structure disposed on the bulk silicon having the <110> crystalline orientation,
wherein the pnp structure includes an emitter, a base and a collector,
wherein the emitter is formed on the base to form a hetero-junction therebetween,
wherein the base is formed on the collector to form a hetero-junction therebetween, and
wherein the collector is disposed on the substrate.

7. The method of claim 6, wherein the substrate further comprises a region including a combination of the <100> crystalline orientation and the <110> crystalline orientation.

8. The method of claim 7, wherein the at least one hetero-junction bipolar structure further includes a second hetero-junction bipolar structure being an npn structure disposed on the bulk silicon of <100> crystalline orientation.

9. The method of claim 6, wherein the bulk silicon of <100> crystalline orientation is incorporated in the silicon-on-insulator (SOI) region of the substrate.

10. The method of claim 6, wherein the bulk silicon of <100> crystalline orientation is a handle wafer.

11. The method of claim 6, wherein the substrate includes at least one of a shallow-trench-isolation (STI) region and a deep trench.

* * * * *